(12) United States Patent
Chuang et al.

(10) Patent No.: US 6,596,082 B2
(45) Date of Patent: Jul. 22, 2003

(54) DUAL CUP SPIN COATING SYSTEM

(75) Inventors: Chih-Chen Chuang, Hsin-chu (TW); Cheng-Hsiang Huang, Hsin-chu (TW); Der-Yun Liu, Hsin-chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/998,493

(22) Filed: Nov. 30, 2001

(65) Prior Publication Data
US 2003/0101928 A1 Jun. 5, 2003

(51) Int. Cl.$^7$ ............................................. B05C 11/02
(52) U.S. Cl. ..................... 118/52; 118/320; 118/326; 427/240; 427/425
(58) Field of Search ..................... 118/52, 320, 326, 118/319; 427/240, 425

(56) References Cited
U.S. PATENT DOCUMENTS 5,312,487 A * 5/1994 Akimoto et al. .............. 118/52
5,660,634 A * 8/1997 Fujiyama et al. ............ 118/319
5,882,433 A * 3/1999 Ueno ............................ 134/31
6,179,915 B1 * 1/2001 Chen ............................ 118/52

* cited by examiner

Primary Examiner—Richard Crispino
Assistant Examiner—Michelle A. Lazor
(74) Attorney, Agent, or Firm—Tung & Associates

(57) ABSTRACT

A dual cup spin coating system for capturing a discharged flowable coating material in a spin coating process including a first outer cup and a second outer cup said first outer cup concentrically disposed around the second outer cup forming a first capture space arranged for capturing at least a portion of a discharged flowable coating material discharged from a process substrate at a first positive angle with respect to the process substrate in a spin coating process; and, an inner cup disposed concentrically within the second outer cup forming a second capture space arranged for capturing at least a second portion of the discharged flowable coating material discharged from the process substrate at a second positive angle less than about the first positive angle with respect to the process substrate in a spin coating process.

20 Claims, 2 Drawing Sheets

DUAL CUP SPIN COATING SYSTEM

FIELD OF THE INVENTION

This invention generally relates to spin coating system and more particularly to a dual cup spin coating system for capturing a flowable spin coating material discharged from a process substrate surface.

BACKGROUND OF THE INVENTION

In the manufacturing processes for integrated circuits, photolithography process, for example, is frequently used for forming features of a semiconductor device on a semiconductor process wafer. The photolithography process generally involves applying a layer of photoresist to the process wafer surface followed by exposure to an activating light source through a mask defining device feature patterns. After development of the exposed photoresist, the photoresist provides, for example, an etching pattern for forming the device feature.

In many cases, the photoresist is applied according to a spin coating process whereby an amount of flowable photoresist is applied to a process surface of the semiconductor process wafer while the process wafer is spinning. The flowable photoresist is distributed over the surface according to centrifugal forces, a portion of the flowable photoresist being discharged of the edge of the semiconductor process wafer into a collecting cup.

Generally, the spin coating system used to apply the flowable photoresist includes a rotatable wafer support platform housed in an ambient controlled chamber. The process wafer adheres to the surface of the wafer support chuck by means of a vacuum force typically applied to a central portion of the wafer support platform by means of a vacuum. In operation, typically an O-ring sealing means is disposed on surface of the wafer support platform (vacuum chuck) to form a vacuum seal around the central portion of the non-process surface (back) of the process wafer to maintain a vacuum suction force to hold the process wafer firmly in place while the wafer support platform is rotated at high speeds.

In a typical spin coating process, an amount of flowable coating material, for example, photoresist is applied to a central portion of the process wafer surface where centrifugal forces induced by the spinning wafer support platform cause the flowable coating material to evenly coat the wafer surface with a thin film of flowable coating material. In many cases, the spinning rate of the wafer support platform may be altered to achieve a more uniform or thinner coating. The spin rate of the wafer support platform is determined by factors such as the viscosity of the flowable coating material, the desired thickness of the flowable coating film, and the rate of solvent evaporation from the coating material.

A conventional spin coating system is shown in FIG. 1 in a cross sectional side view representation. The spin coating system 10, includes a drain cup 12 and a vacuum chuck 20 attached to rotatable shaft 32, a vacuum force being applied through rotatable shaft 32 to vacuum chuck 20 for rotating process wafer 26B held in adjacent relation to vacuum chuck 20 by means of the vacuum force. The drain cup 12 includes an outer cup 12A portion enclosing and surrounding the process wafer and having an inner face portion 14A disposed above the periphery of the process wafer circumferential edge designed to intercept flowable coating material discharged at a positive angle with respect to the process wafer surface 26A following for example, trajectories C1 and C2, thereby deflecting it into the drain region 16. The drain region 16 of the drain cup 12 is formed between the outer cup portion 12A and an inner cup portion 12B disposed below the peripheral portion of the process wafer. The drain region 16 is may optionally be supplied with a positive or negative air pressure source (not shown) for aiding the removal of the discharged flowable coating material through exhaust pathway 18.

In operation, the vacuum chuck 20 is rotated at a predetermined rate causing process wafer 26B to spin at a predetermined rate while a flowable coating material dispenser (not shown) disposed above the central portion of the process wafer 26B dispenses a pre-determined amount of flowable coating material at a pre-determined rate. The flowable coating material is spread out from the central portion of the process wafer by centrifugal forces toward the circumference of process wafer 26B where excess flowable coating material is discharged off the circumferential edge of the process wafer 26B to be captured by drain cup 12 in drain region 16 and subsequently removed.

One problem with the prior art spin coating system is the collection of back spattered coating material onto the process wafer surface. In typical operation, as the flowable coating material is discharged off the circumferential edge of the process wafer, a certain portion, especially at higher speeds, for example 3000 to 4000 rpm, follows, for example, trajectory C3 impacting the inner face portion 14B of the drain cup 12. As a result of the impact, the flowable coating material is back spattered from inner face portion 14B and may follow, for example, trajectory A or B. Consequently, following for example, trajectory B, a portion of the back spattered material, frequently in particulate form, is deposited on the process wafer surface 26A, contaminating the surface and interfering with subsequent semiconductor wafer processing operations. For example, the contaminating particles can interfere with exposure and development of photoresist patterns thereby causing defects in critical dimensions of semiconductor device features.

Another shortcoming of the prior art spin coating system are discontinuities caused in the coating near the process wafer circumferential edge. According to the prior art drain cup 12, the upper portion of the outer cup portion 12A including inner face portion 14B, causes turbulence including the formation of eddy currents over the circumferential edge portion of the process wafer surface. As a result, that portion of flowable coating material discharge upward a positive angle to the process wafer surface is increased, thereby not only causing non-uniformities along the circumferential edge of the process wafer, but exacerbating the degree of particle contamination on the process wafer surface caused by discharged flowable coating material back spattering off the inner face portion 14B of the drain cup 12.

There is therefore a need in the semiconductor processing art to develop a spin coating system that more effectively captures discharged excess flowable coating material and that reduces the turbulence present around the circumferential edge of a process substrate thereby minimizing contamination of the substrate process surface and improving the coating uniformity at the circumferential edge of a process substrate.

It is therefore an object of the invention to provide to develop a spin coating system that more effectively captures discharged excess flowable coating material and that reduces the turbulence present around the circumferential edge of a process substrate thereby minimizing contamination of the substrate process surface and improving the coating uniformity at the circumferential edge of a process substrate while overcoming other shortcomings and deficiencies in the prior art.

SUMMARY OF THE INVENTION

To achieve the foregoing and other objects, and in accordance with the purposes of the present invention, as embodied and broadly described herein, the present invention provides a dual cup spin coating system for capturing a discharged flowable coating material in a spin coating process.

In a first embodiment according to the present invention, the dual cup spin coating system includes a first outer cup and a second outer cup said first outer cup concentrically disposed around the second outer cup forming a first capture space arranged for capturing at least a portion of a discharged flowable coating material discharged from a process substrate at a first positive angle with respect to the process substrate in a spin coating process; and, an inner cup disposed concentrically within the second outer cup forming a second capture space arranged for capturing at least a second portion of the discharged flowable coating material discharged from the process substrate at a second positive angle less than about the first positive angle with respect to the process substrate in a spin coating process.

In another embodiment, at least the first outer cup and second outer cup respectively form a first and second intercept surface wherein a perpendicular thereto forms an intercept angle of between about 0 degrees and about 90 degrees with respect to the process substrate surface for capturing at least a portion of the discharged flowable coating material.

In another embodiment, the second capture space includes a first exhaust pathway for removing the discharged flowable coating material. Further, the first capture space communicates with the second capture space by means of at least one second exhaust pathway for removing the discharged flowable coating material. Further yet, the at least one second exhaust pathway further comprises at least one opening formed through the periphery of the second outer cup. Yet further, the at least one opening comprises a plurality of openings including at least one of a circular, right circular, and polygonal shape.

In another embodiment, the first and second outer cups include coupling means for coupling to a rotatable shaft for spinning the process substrate such that the rotatable shaft spins the at least the first and second outer cups synchronously with the process substrate.

In yet another embodiment, at least one of a vacuum chuck for mounting the process substrate and the dual cup spin coating system include means for adjusting a level of the process substrate with respect to at least the first and second outer cups.

In a further embodiment, at least a first notched region and second notched region are formed in the first and second intercept surfaces, respectively, extending circumferentially along the first and second intercept surfaces adjacent to a respective inner diameter of the first and second outer cups for reducing turbulence.

In another embodiment, the first capture space is arranged to capture about 15 to about 30 percent of the discharged flowable material and the second capture space is arranged to capture about 70 to about 85 percent of the discharged flowable material.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

It will be appreciated that the dual cup spin coating system according the present invention represents only a portion of the spin coating system and may be used or modified to be used with a wide variety of spin coating system including those spin coating systems with unconventional vacuum chucks, and including drain cups that may be fitted to a vacuum or other negative or positive pressure producing means to aid in the drainage from the drain cups.

Figure 1:
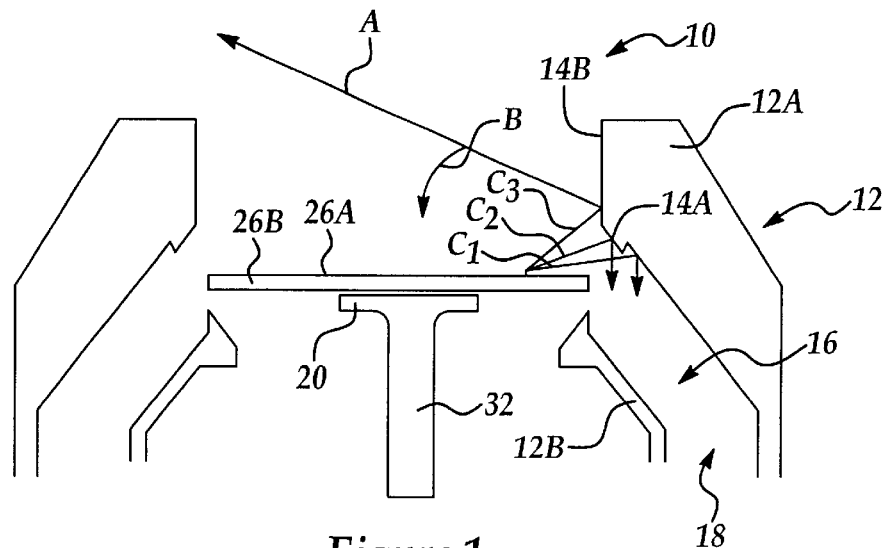
FIG. 1 is a cross sectional side view representation of a single drain cup spinning system according to the prior art.
Figure 2:
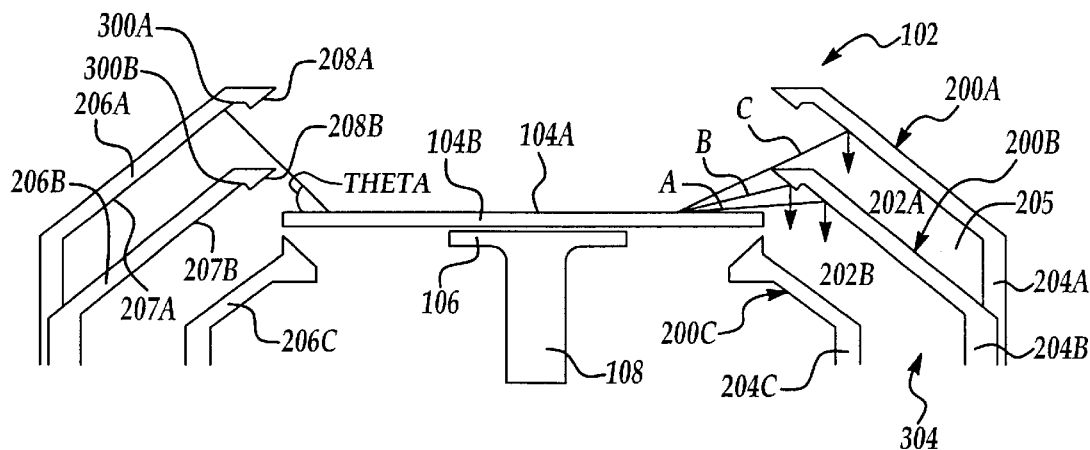
FIG. 2 is a cross sectional side view representation of one embodiment of a dual cup spin coating system according to the present invention.

Referring to FIG. 2, is shown one embodiment of the dual cup spin coating system according to the present invention. A dual cup spin coating system 102 according to the present invention is disposed around the periphery of process substrate 104B, for example, a semiconductor process wafer, supported on a vacuum chuck 106, in communication with a vacuum source (not shown) through rotatable shaft 108 for supplying a vacuum force to process substrate 104B thereby holding it in place while spinning rotatable shaft 108. In one embodiment, an outer cup portion includes two circularly shaped members concentric with one another forming a first outer cup 200A and a second outer cup 200B. The first outer cup 200A is disposed concentric to and surrounding second outer cup 200B with an offset space between first outer cup 200A and second outer cup 200B forming first capture space 202A. First outer cup 200A is preferably attached to second outer cup 200B at the periphery of outer cups 200A and 200B where outer cups 200A and 200B have cup wall members 204A and 204B, preferably arranged about vertical to the process substrate, disposed adjacent to one another to form a closed area 205 at the periphery of capture space 202A. Cup wall members 204A and 204B are preferably adjacently fitted to form a seal by any conventional means including a compression fit or an o-ring seal between adjacent surfaces of cup wall members 204A and 204B.

Outer cups 200A and 200B preferably include angled cup wall members 206A and 206B, respectively, extending radially inward to an inner diameter 205A and 205B, respectively, of outer cups 200A and 200B from the periphery of respective cup wall members 204A and 204B. Angled cup wall members 206A and 206B form respective intercept surfaces 207A and 207B having a direction perpendicular thereto forming an intercept angle theta, with the process substrate surface 104A and arranged to capture at least a portion of the flowable material discharged from the process substrate with a positive take off angle of less than about 90 degrees following for example, trajectories A, B, and C.

Angled cup wall members 206A and 206B are preferably terminated at an inner diameter of the of the first and second outer cups 200A and 200B by inner face surfaces 208A and 208B, respectively, that are preferably parallel to angled cup wall members 206A and 206B. The inner face surfaces 208A and 208B preferably include flat surfaces disposed outside and above the diameter of the process substrate 104B. Preferably the height of the outer cups 200A and 200B extending above the process substrate surface 104A may be adjusted, either by adjusting the height of the vacuum chuck 106 or the height of the outer cups 200A and 200B extending above a level of the process substrate surface 104A such that the inner face surfaces 208A and 208B including capture space 202B intercept at least a portion of flowable material discharged at a positive take off angle with respect to the process substrate surface of less than about 90 degrees. Further, inner face surfaces 208A and 208B and angled cup wall members 206A and 206B preferably form intercept surfaces, 207A and 207B, respectively, having a perpendicular direction thereto forming intercept angle theta with the process wafer substrate surface 104A of between about 35 and about 55 degrees, most preferably about 45 degrees.

The inner face surface 208A and 208B are further preferably formed to extend toward process substrate 104B from angled cup wall members 206A and 206B thereby forming notched areas (dimpled regions) 300A and 300B in intercept surfaces 207A and 207B, respectively. Notched areas 300A and 300B may include an angled notch or a radial notch, the notched areas serving to reduce eddy current backflow (turbulence) over the process substrate surface 104A. Further, angled cup wall members 206A and 206B may optionally include a plurality of dimpled regions, (not shown), preferably having a radius, formed in intercept surfaces 207A and 207B to extend from a respective inner diameter radially toward the periphery of respective outer cups 200A and 200B at least along a portion of the intercept surfaces.

Outer cups 200A and 200B may optionally be attached to rotatable shaft 108 separately from inner cup 200C to allow outer cups 200A and 200B to synchronously rotate with process substrate 104B while inner cup 200C remains stationary. Any conventional coupling means may be used, for example, a bearing or O-ring containing coupling attached to inner cup 200C to allow it to remain stationary, while a conventional clamping coupling means firmly attaches outer cups 200A and 200B to the rotatable shaft 108 for synchronous rotation. Preferably, inner cup 200C includes an angled cup wall member 206C that is parallel with angled cup wall members 206A and 206B of outer cups 200A and 200B. Further, inner cup 200C is concentrically disposed within second outer cup 200B, the angled cup wall member 206C preferably being terminated at about the peripheral edge of process substrate 104B and arranged below the process substrate 104B to form a second capture space 202B for capturing discharged flowable coating material from the process substrate. Capture space 202B is preferably in communication with an exhaust pathway 304 preferably formed between cup wall members 204B of outer cup 200B and cup wall member 204C of inner cup 200C.

In one embodiment of the present invention as explained with respect to FIG. 2, in operation, referring to FIG. 2, process substrate 104B is held against vacuum chuck 106 by a vacuum supplied through rotatable shaft 108. Flowable coating material (not shown) is added to a central portion of process substrate surface 104A by a dispenser, for example, a nozzle (not shown) while rotatable shaft 108 is rotated, for example, by motorized means thereby spinning process substrate 104B. Flowable coating material is carried by centrifugal force across process substrate surface 104A to the circumferential region of the process substrate surface 104A where it is discharged at various positive take off angles between about 0 and about 90 degrees as conceptually depicted by trajectories A, B, and C. Discharged flowable coating material following, for example, trajectory C is captured in capture area 202A. In most cases, the discharged flowable coating material following trajectory C will form a particulate which will be collected at closed area 205, where it will remain, preferably aided by the centrifugal force of synchronously spinning outer cups 20A and 20B. In some applications, an exhaust means will not be required in closed area 205 due to the small amount of particulate capture that will accumulate.

Figure 3:
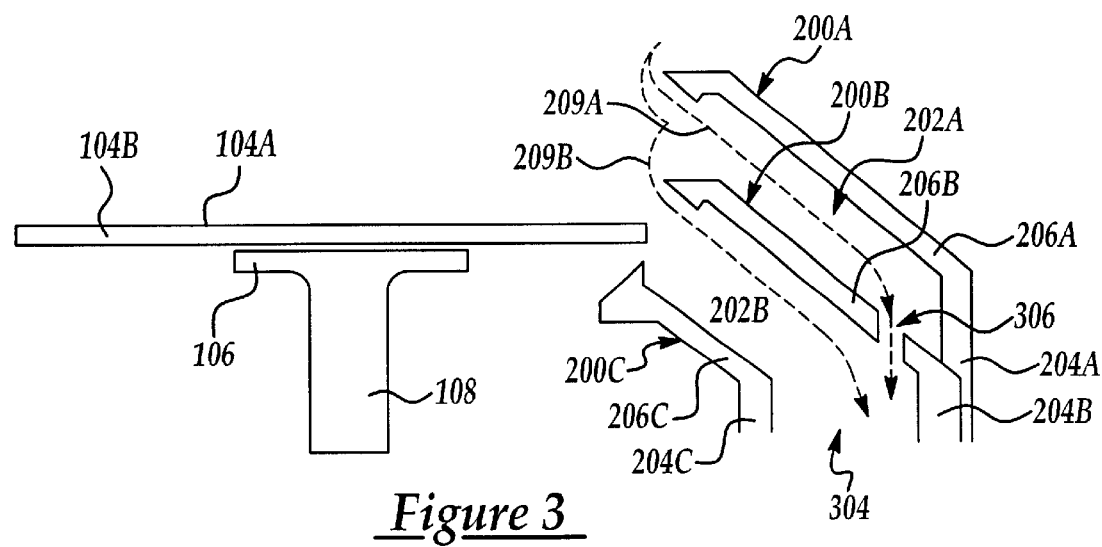
FIG. 3 is a cross sectional side view representation of another embodiment of a dual cup spin coating system according to the present invention.

In another embodiment according to the present invention, as shown in FIG. 3, at least one exhaust opening e.g., 306 is formed through angled member 206B in second outer cup 200B forming an exhaust communication pathway with exhaust pathway 304. The at least one exhaust opening, e.g., 306 may include a single opening extending around the periphery of angled member 206B, however, preferably, the at least one exhaust opening includes a plurality of exhaust openings formed along the periphery of angled member 206B forming a flowable communication pathway between capture space 202A and capture space 202B to include flowable communication with exhaust pathway 304. For example, in exemplary operation, discharged flowable material including particulates follow flow pathways 209A and 209B, respectively, through first capture space 202A and 202B capturing for example about 20 percent of the discharged flowable material including particulates in capture space 202A and about 80 percent in capture space 202B.

Figure 4:
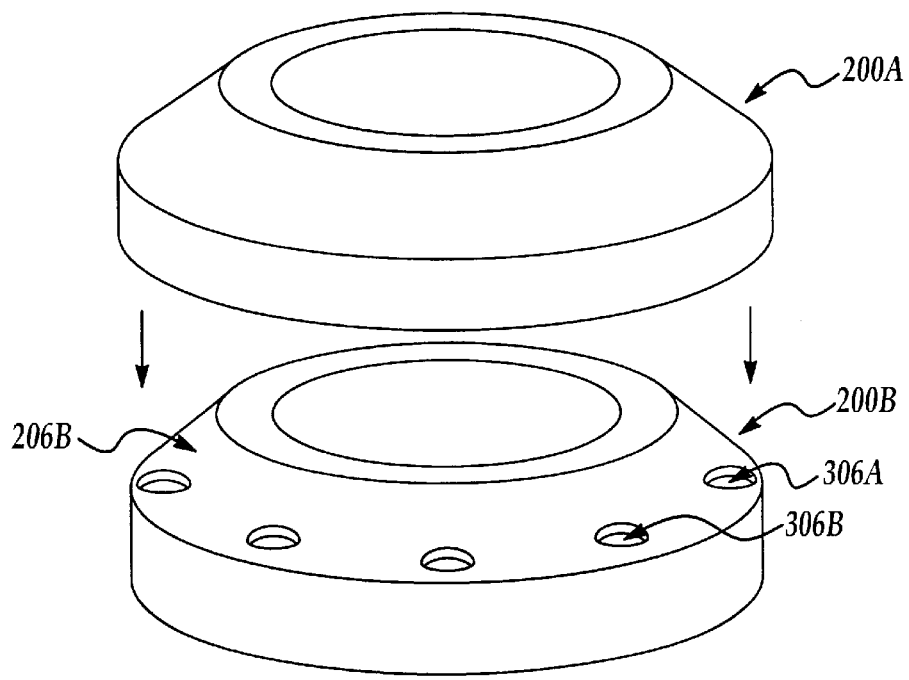
FIG. 4 is an expanded planar three-dimensional representation of an embodiment of a dual cup spin coating system according to the present invention.

Referring to FIG. 4, the exhaust openings, e.g., 306A, 306B, may be of any shape including circular, right circular, polygonal etc. The exhaust openings, e.g., 306A, 306B, may be periodically spaced along the periphery of angled member 206B and may be of variable size and spacing depending on the desired suction draft created in capture area 202B. It will be appreciated that the magnitude of the suction draft created by the exhaust openings will depend on several factors including the spin rate of the synchronously rotated outer cups 200A and 200B, the height of the outer cups 200A and 200B with respect to the process substrate surface 104A, and the number of the exhaust openings, e.g., 306A, 306B.

In an exemplary embodiment, for example, referring to FIG. 4 the exhaust openings, e.g., 306A, 306B are round openings from about 0.5 to about 1.5 centimeters in diameter spaced at intervals of about 5 to about 10 degrees around the periphery of angled cup wall member 206B of second outer cup 200B. Preferably, the dual cup spin coating system including the first and second outer cups 200A and 200B include of a chemically inert material such as polypropylene at least on the contact surfaces. In this embodiment, it has been found that in spinning a process substrate at about 3500 to about 400 rpm that about 15 to about 30 percent of the discharged flowable material is captured in capture area 202A while about 70 to about 85 percent is captured in capture area 202B. Further, it has been found according to the present invention, that the uniformity of the coating at the periphery of the process substrate is improved and that the turbulence present at the periphery of the process substrate is reduced by approximately 20 percent compared to a single spin cup according to the prior art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A dual cup spin coating system for capturing a discharged flowable coating material in a spin coating process comprising:

a first outer cup and a second outer cup said first outer cup concentrically disposed around the second outer cup forming a first capture space arranged for capturing at least a first portion of a discharged flowable coating material discharged from a process substrate at a first positive angle with respect to the process substrate in a spin coating process;

an inner cup disposed concentrically within the second outer cup forming a second capture space arranged for capturing at least a second portion of the discharged flowable coating material discharged from the process substrate at a second positive angle less than about the first positive angle with respect to the process substrate in a spin coating process;

said inner cup and outer cup respectively comprising first and second angled cup wall members each forming first intercept surfaces said first and second angled cup wall members terminated at a respective inner diameter to form second intercept surfaces wherein a perpendicular direction to said first and second intercept surfaces forms at least one intercept angle theta with respect to the process substrate surface for intercepting discharged material during a spin coating process to deflect the discharged material into at least one of the first and second capture spaces.

2. The dual cup spin coating system of claim 1, wherein the perpendicular direction form the at least one intercept angle theta between about 35 and about 55 degrees.

3. The dual cup spin coating system of claim 1, wherein the second capture space includes a first exhaust pathway for removing the first and second portions of discharged flowable coating material.

4. The dual cup spin coating system of claim 3, wherein the first capture space communicates with the second capture space by means of at least one second exhaust pathway for removing the first portion of discharged flowable coating material.

5. The dual cup spin coating system of claim 4, wherein the at least one second exhaust pathway further comprises at least one opening formed through the periphery of the second outer cup.

6. The dual cup spin coating system of claim 5, wherein the at least one opening comprises a plurality of openings including at least one of a circular, right circular, and polygonal shape.

7. The dual cup spin coating system of claim 1, wherein at least the first and second outer cups include coupling means for coupling to a rotatable shaft for spinning the process substrate such that the rotatable shaft spins the at least the first and second outer cups synchronously with the process substrate.

8. The dual cup spin coating system of claim 1, wherein at least one of a vacuum chuck for mounting the process substrate and the dual cup spin coating system include means for adjusting a level of the process substrate with respect to at least the first and second outer cups.

9. The dual cup spin coating system of claim 1, wherein the second intercept surfaces extend towards the process substrate surface to form at least a first notched region extending circumferentially adjacent to a respective inner diameter of the first and second outer cups for reducing turbulence.

10. The dual cup spin coating system of claim 1, wherein the first capture space is arranged to capture about 15 to about 30 percent of the discharged flowable material and the second capture space is arranged to capture about 70 to about 85 percent of the discharged flowable material.

11. A dual cup spin coating system for capturing a discharged flowable coating material in a spin coating process comprising:

a first outer cup and a second outer cup said first outer cup concentrically disposed around the second outer cup forming a first capture space arranged for capturing at least a first portion of a discharged flowable coating material discharged from a process substrate at a first positive angle with respect to the process substrate in a spin coating process;

an inner cup disposed concentrically within the second outer cup forming a second capture space arranged for capturing at least a second portion of the discharged flowable coating material discharged from a process substrate at a second positive angle less than about the first positive angle with respect to the process substrate in a spin coating process;

said inner cup and outer cup respectively comprising first and second angled cup wall members each forming first intercept surfaces said first and second angled cup wall members terminated at a respective inner diameter to form second intercept surfaces wherein a perpendicular direction to said first and second intercept surfaces forms at least one intercept angle theta with respect to the process substrate surface for intercepting discharged material during a spin coating process to deflect the discharged material into at least one of the first and second capture spaces; and, at least one exhaust pathway in flowable communication with at the first and second capture spaces for removing the discharged flowable coating material from each of the first and second capture spaces simultaneously.

12. The dual cup spin coating system of claim 11, wherein the perpendicular direction form the at least one intercept angle theta between about 35 and about 55 degrees.

13. The dual cup spin coating system of claim 11, wherein the exhaust pathway further includes the first capture space in flowable communication with the second capture space by means of at least one opening formed through the periphery of the second outer cup.

14. The dual cup spin coating system of claim 13, wherein the at least one opening comprises a plurality of openings including at least one of a circular, right circular, and polygonal shape.

15. The dual cup spin coating system of claim 11, wherein at least the first and second outer cups include coupling means for coupling to a rotatable shaft for spinning the process substrate such that the rotatable shaft spins the at least the first and second outer cups synchronously with the process substrate.

16. The dual cup spin coating system of claim 11, wherein at least one of a vacuum chuck for mounting the process substrate and the dual cup spin coating system include means for adjusting a level of the process substrate with respect to at least the first and second outer cups.

17. The dual cup spin coating system of claim 11, wherein the second intercept surfaces extend towards the process substrate surface to form at least a first notched region extending circumferentially adjacent to a respective inner diameter of the first and second outer cups for reducing turbulence.

18. The dual cup spin coating system of claim 12, wherein the at least one intercept angle comprises a single intercept angle.

19. The dual cup spin coating system of claim 11, wherein the first and second outer cups further comprise a chemically inert material including polypropylene.

20. The dual cup spin coating system of claim 11, wherein the first capture space is arranged to capture about 15 to about 30 percent of the discharged flowable material and the second capture space is arranged to capture about 70 to about 85 percent of the discharged flowable material.

* * * * *